United States Patent [19]

Santana

[11] 4,178,547

[45] Dec. 11, 1979

[54] REMOTE MICROPHONE WITH APPROVED CHANNEL SELECTOR

[76] Inventor: Miguel E. Santana, 1050 Monte Verde Dr., Arcadia, Calif. 91006

[21] Appl. No.: 725,496

[22] Filed: Sep. 22, 1976

[51] Int. Cl.$^2$ ............................................. H01B 1/38
[52] U.S. Cl. ...................................... 325/16; 325/25; 325/183; 325/391
[58] Field of Search .................. 325/15, 16, 355, 390, 325/391, 21, 22, 417, 459, 25, 183; 340/309.1; 73/5; 235/103, 104, 117 A, 118, 144 R; 179/179, 175.24, 167; 200/157, 61.58 R, 61.85

[56] References Cited

U.S. PATENT DOCUMENTS

| | | | |
|---|---|---|---|
| 2,421,516 | 6/1947 | Mitchell | 325/16 |
| 3,696,395 | 10/1972 | Barron | 340/309.1 |
| 3,722,461 | 3/1973 | Forman | 235/117 A |
| 3,903,515 | 9/1975 | Haydon et al. | 340/309.1 |
| 3,968,440 | 7/1976 | Ehni | 325/417 |
| 3,969,673 | 7/1976 | Nordlof | 325/16 |
| 3,973,228 | 8/1976 | Mueller | 325/459 |
| 4,032,844 | 6/1977 | Imazeki | 325/15 |
| 4,110,690 | 8/1978 | Kakigi | 325/25 |

OTHER PUBLICATIONS

"SBE Touch/COM the Mike That Does It All," Popular Electronics, (May. 12, 1976)., Jun. 1976 issue.
Meriton, RK-380 FM/AM Electronic Digital Clock Radio, Jul. 1976.
Radio Shack, 1977 Electronics Catalog, p. 130.
Motorola, by Ned Chase., Mar. -Apr. 1952.
Harris, RF Communications, Series 1525, VHF-FM Two Way Mobile Radios, Jan. 29, 1974.

Primary Examiner—Robert L. Griffin
Assistant Examiner—Tommy P. Chin
Attorney, Agent, or Firm—Lewis Anten

[57] ABSTRACT

A microphone, which may be hand held for use in association with a radio transceiver, including transceivers commonly known as Citizen Band Radios, has novel means associated with the microphone for selecting and indicating the receiving or broadcasting channel of the transceiver.

9 Claims, 10 Drawing Figures

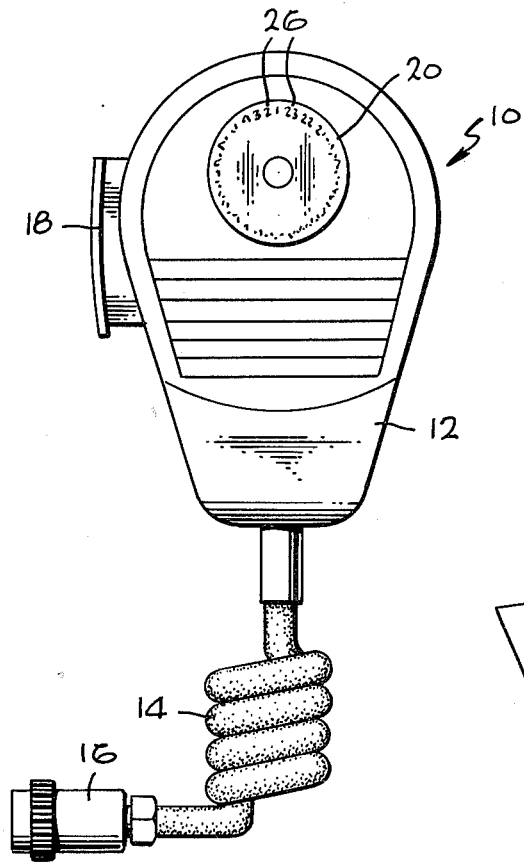
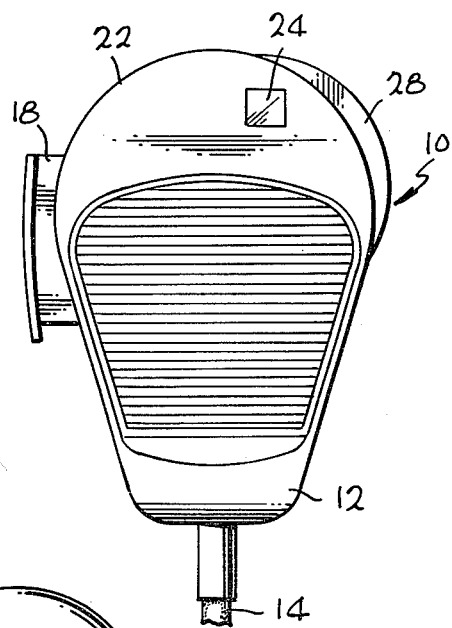
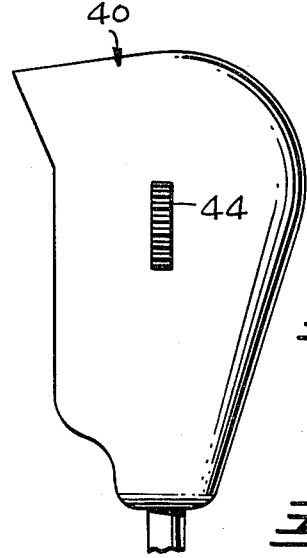
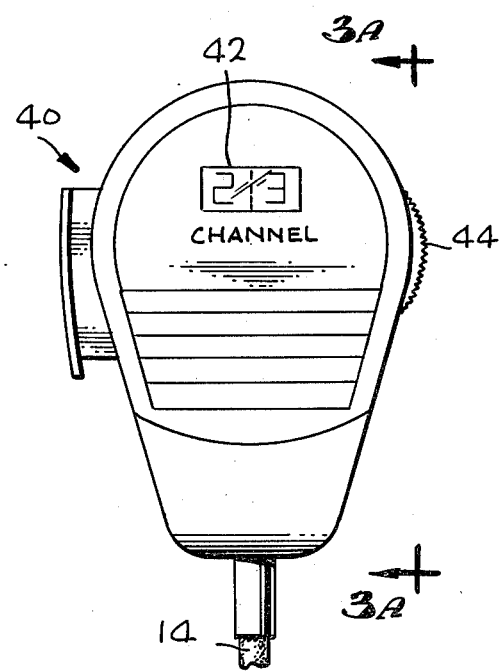
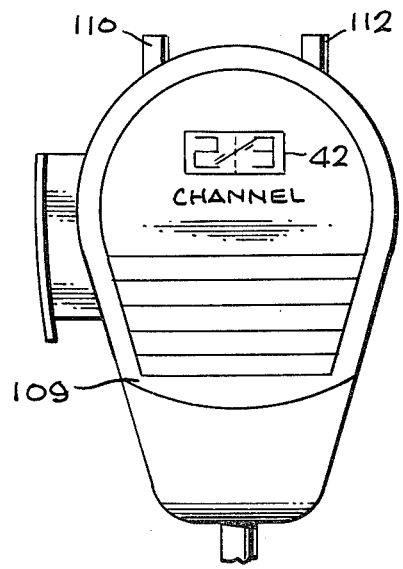

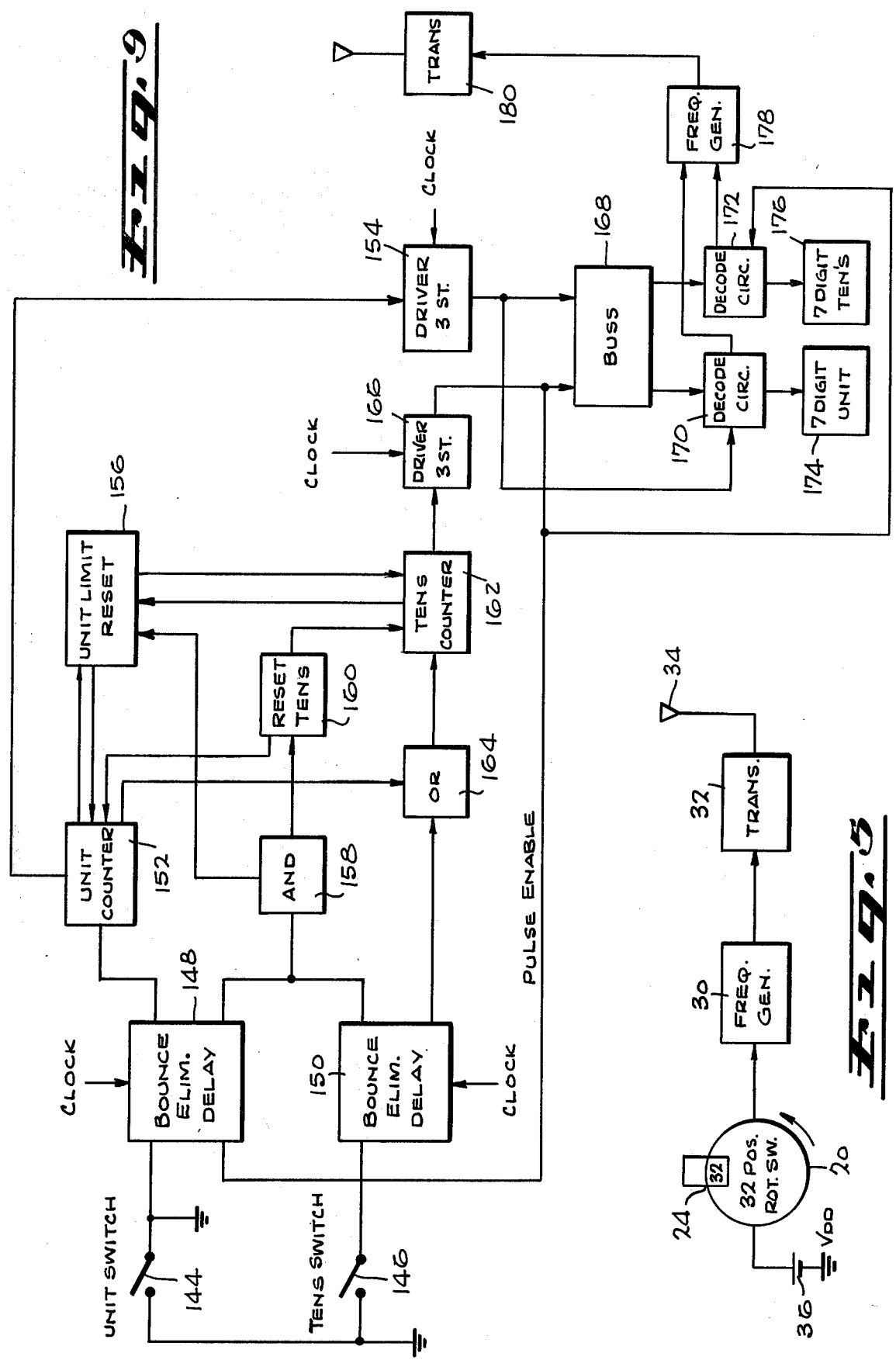

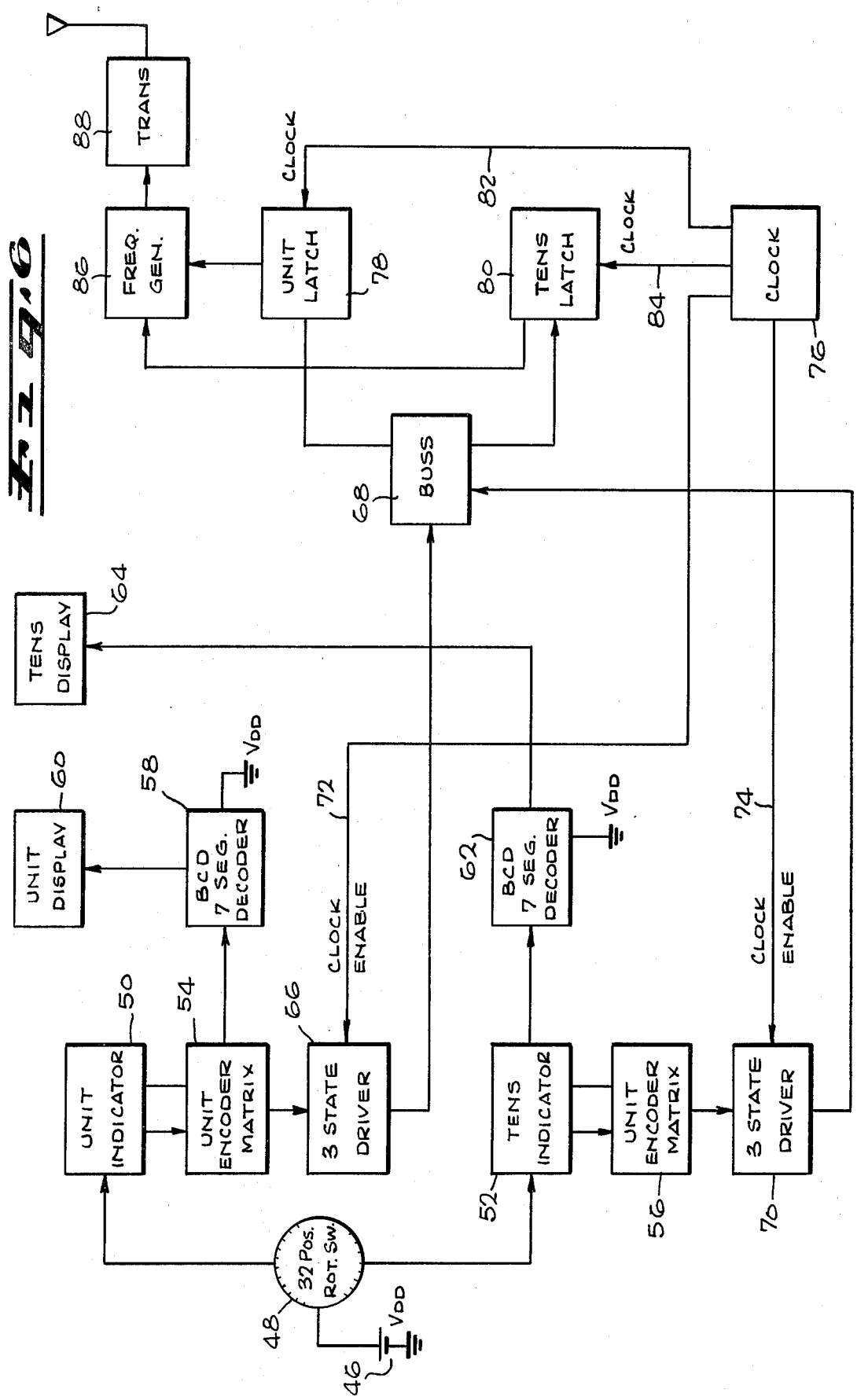

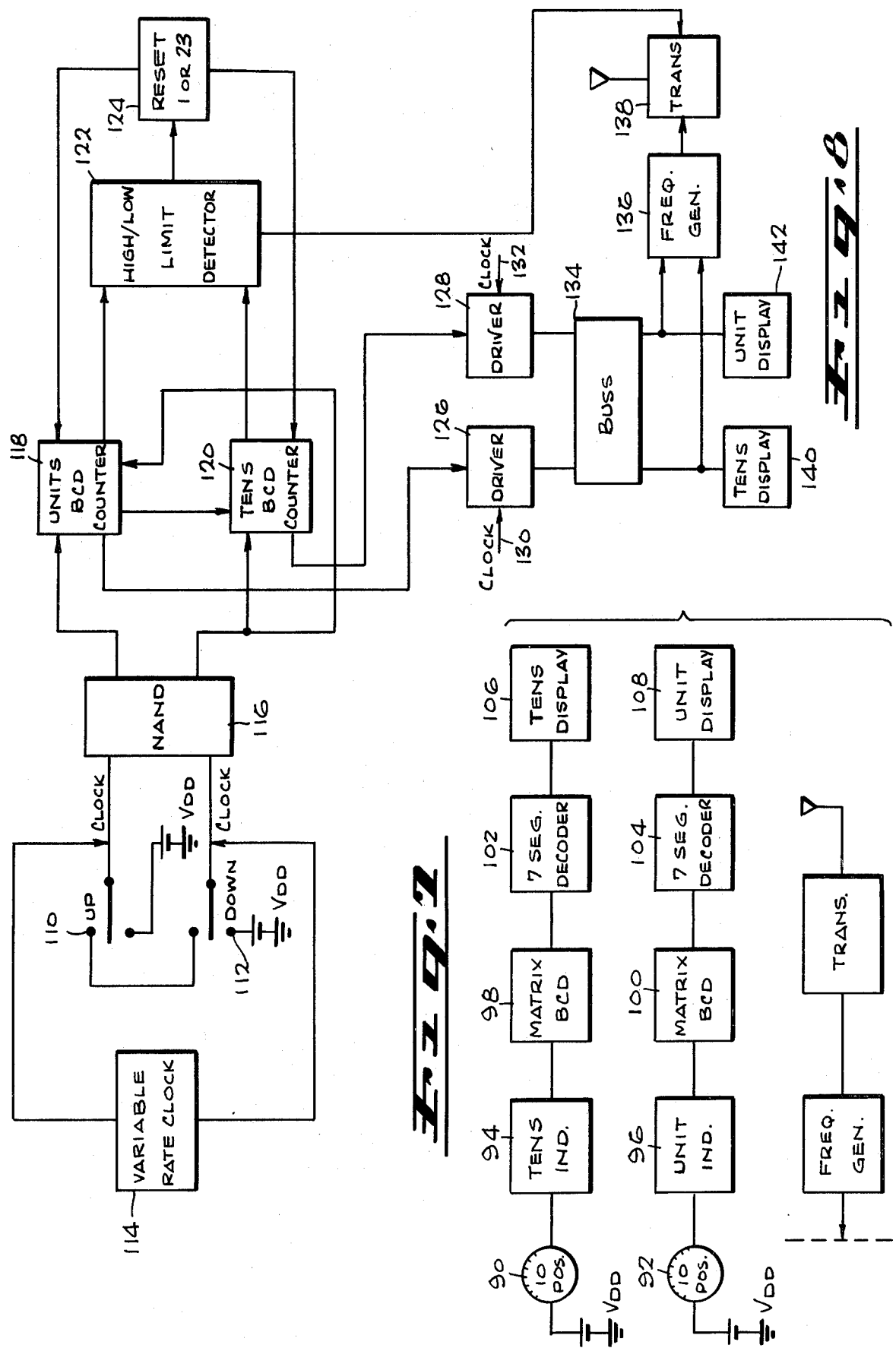

REMOTE MICROPHONE WITH APPROVED CHANNEL SELECTOR

BACKGROUND OF THE INVENTION

The present invention relates generally to microphones which are used remotely from a receiving/broadcasting unit, such as a hand-held microphone. Such microphones are most widely used in association with transceivers commonly known as Citizen Band Radios and are ordinarily small and light enough to be hand held.

In previous remote microphone units selection of the receiving or broadcasting channel of the transceiver required manipulation of controls located on the main chassis of the transceiver. The microphones were attached to the chassis of the transceiver by a flexible means, such as a cable. Such microphones, however, had no facility associated with the microphone unit for controlling the operation of the microphone. Manipulation of a channel selection control located on the main chassis of the transceiver was required by the operator of the unit to vary the receiving or broadcasting channel of the transceiver which would also display the selected channel.

In the instance of a person driving a car or truck, any time spent on the visual inspection and physical manipulation of controls presents severe dangers since a vehicle travelling at the maximum permitted rate of speed of 55 m.p.h. will travel 80 feet in only one second. Thus, even a fraction of a second of inattention to the road could result in an accident.

Previously available microphones have had control means associated with the hand-held unit as well as digital display of the selected channel. In addition the microphone unit has had controls for switching the transceiver from a receiving to a transmitting mode of operation as well as means for switching the transceiver on and off. All such operations require the visual attention and manipulation thereby contributing to the dangers inherent while operating a vehicle. United States Patents to Coenen, et al. U.S. Pat. No. 3,822,372 and Guttinger U.S. Pat. No. 3,586,807 discloses remote microphones which have controls associated with the microphone unit.

In the present invention the microphone unit, which is remote from the chassis of the transceiver unit, has a means associated with the remote microphone unit for displaying, by improved means, in digital form, the channel of the transceiver. In such a manner, the microphone unit can be held in view of the driver to rapidly select a desired channel. The conventional push-to-talk and on/off switches associated with the prior art remote microphones may also be included in the microphone housing. Various lighting means may be incorporated with the channel display, to permit viewing and operation of the microphone in dark locations.

Also, means for selecting the desired channel must be such as to reduce, as much as possible, the time required. Even though the microphone unit has the channel display on it, repeatedly having to look at the channel display to see if the proper channel has been obtained can contribute to a dangerous condition.

In the present invention, means for switching the channel is achieved by solid state circuitry, which may be included in the microphone case, for rapidly, easily and accurately obtaining the proper channel.

OBJECTS OF THE INVENTION

It is an object of the present invention to provide a microphone unit which is remote from the transceiver unit and which has a novel associated channel indicator;

It is another object of the present invention to provide a microphone unit remote from the transceiver unit which has an improved means for selecting the desired channel;

It is a further object of the present invention to provide a microphone unit remote from the transceiver unit which has a digital display of the selected broadcast channel which may be easily read;

It is still another object of the present invention to provide a digital display for a microphone unit remote from the transceiver which employs light emitting diodes which may be viewed in a generally unlighted area;

It is a further object of the present invention to provide improved channel selectors for rapidly and conveniently locating a desired cast channel;

It is yet another object of the present invention to provide a microphone unit remote from the transceiver which is safe and convenient to use;

It is still another object of the present invention to provide a remote microphone unit which is simple to operate;

It is also another object of the present invention to provide circuitry for reliably and accurately generating a signal representative of the selected channel.

These and other objects of the present invention will be evident from a view of the following description of the invention, including the drawings which are attached hereto.

BRIEF DESCRIPTION OF THE DRAWINGS

Referring to the drawings,

FIG. 1 is a front view of a hand-held microphone in which the cover of the channel indicator and thumb wheel engagement means are not shown.

FIG. 2 is a front view of the hand-held microphone shown in FIG. 1 showing a thumb wheel and the cover of the microphone unit in place.

FIG. 3 is an alternative hand-held microphone in which an LED digital display of the broadcast channel is shown, the channel selection operated by a thumb wheel control.

FIG. 3A is a side view of the microphone unit of FIG. 3.

FIG. 4 is an embodiment of the present invention in which two push button switches are employed to control the selection.

FIG. 5 is a circuit diagram, in block form, for the channel selection and transmitting for the hand-held microphone shown in FIG. 1.

FIG. 6 is a circuit diagram, in block form, of the circuitry associated with the channel selector and transmitting circuitry of the microphone unit of FIG. 3.

FIG. 7 is a circuit diagram, in block form, for an alternative embodiment of the present invention employing two thumb wheels for operating an electronic digital display.

FIG. 8 is the circuitry, shown in block form, of the channel selection and transmitting means for the embodiment shown in FIG. 4.

FIG. 9 is an alternative circuit diagram, in block form, of the circuitry for the channel selection and transmitting means for the embodiment shown in FIG. 4.

DETAILED DESCRIPTION OF THE DRAWINGS

Referring to the drawings, FIG. 1 is a front view of the microphone unit 10 with the front cover and thumb wheel not shown. The microphone unit 10 comprises a microphone case 12 which is connected to a chassis (not shown) which normally contains the transceiver and other controls for receiving and transmitting a broadcast signal. The microphone unit 10 is connected to the chassis by a coaxial cable 14 terminating in a connector assembly 16, usually male, for attachment to a cooperating female connecting assembly located on the chassis. The microphone unit 10 has a push-to-talk button 18 and a speaker (not shown) conventionally associated with a microphone unit. A circular channel dial selector 20 is associated with the microphone case 12 of the microphone unit 10, electrically connected to the transceiver so that the frequency generator generates a signal dependent upon the angular displacement of the circular channel dial selector 20. The channel selector dial 20 has the channel numbers 26 located about its circumference.

FIG. 2 is a view of the microphone unit 10 of FIG. 1 in which a cover 22 having a window opening 24 so positioned as to be able to view one of the plurality of numbers 26 located around the circumference of the circular channel dial selector 20. A thumb wheel 28 is rotatably attached to the microphone case 12 and engaged to the circular channel dial selector 20 by gears or other conventional manners so that rotation of the thumb wheel 28 will result in the rotation of the circular channel dial selector 20.

Referring to FIG. 5 of the circuitry, shown in block form, associated with the microphone unit of FIGS. 1 and 2 is shown. The circular channel dial selector 20 is connected at one side to ground 34 and at its other terminal to a supply voltage 36. The supply voltage 36 may be regulated by any number of conventional voltage regulation circuits.

The circular channel dial selector 20 has, in the embodiment shown, thirty-two positions, however, the number of positions may be more or less, so as to correspond to the number of channels authorized by the FCC for transmission from citizen band radios. The viewing window 24 located in the cover 22 of the microphone case 12 permits viewing the channel indicated on the circular channel dial selector 20. The output of the circular channel dial selector 20 is connected to a frequency generator 30 which is in turn connected to the transceiver 32 for broadcast or receipt of the desired channel selected as indicated on the circular channel dial selector 20.

Referring to FIG. 3, an embodiment of the present invention is shown in which the microphone unit 40 has an electronic digital display 42. The LED digital display indicates the channel on which the transceiver is sending and receiving. The digital display 42 corresponding to the broadcast channel may be selected by rotation of a thumb wheel 44. FIG. 3A is a right side view of the embodiment of the present invention shown in FIG. 3 showing the thumb wheel 44 in side view.

The term Electronic Digital Display is meant to be any manner of displaying a digit or symbol, other than by fixed numerals or symbols such as shown in FIG. 1 of the drawings. Electronic digital display may include light emitting diodes, crystals, neon tubes or any other electronic means of displaying a number, letter, or symbol in response to an electrical signal or field. For example, in place of the use of the numerals for indicating a desired channel, characters of the alphabet may be employed whereby Channel A would indicate Channel 1, B Channel 2, and so forth.

Referring to FIG. 6, the circuit diagram, shown in block form, of the circuitry associated with the embodiment of FIG. 3 in which an electronic digital display of the channel is indicated is shown.

Voltage supply Vdd 46 is connected to one terminal of a twenty-three position rotary switch 48. The twenty-three position rotary switch 48 is, in the preferred embodiment, a single-throw break-before make switch. The output of the rotary switch 48 is connected to a units indicator 50 and a tens indicator 52, which are in turn connected to units and tens encoder matrix 54 and 56 which generates a four (4) bit binery-coded decimal (BCD) signal compatible with the needs of a frequency generation system. The output of the unit encoder matrix 54 is connected to the input of a seven segment BCD decoder and driver 58 which in turn drives the unit digits digital display 60. Similarly, one output of the tens encoder matrix 56 is connected to a seven segment BCD decoder and driver 62 which has its output connected to a tens digit LED digital display for displaying the tens digit of the channel 64.

A second output of the unit encoder matrix 54 is connected to a three state driver 66 which has its output connected to a data buss line 68. Similarly, a second output of the tens encoder matrix 56 is connected to the input of a three state driver 70 which has its output connected to the data buss line 68. The three state drivers 66 and 70 receive an input enable clock signal 72 and 74 respectively from clock 76. One output of the data buss 68 is connected to a unit latch 78 and a second output of the data buss 68 is connected to a tens latch 80. The unit latch 78 and the tens latch 80 receive a clock enable signals 82 and 84 from clock 76. The outputs of the tens latch 80 and the units latch 78 are connected to a frequency generator 86 which in return is connected to the transceiver 88.

The operation of the circuitry of FIG. 6 is as follows:

As the rotary switch 48 is moved from channel to channel by operation of rotating the thumb wheel, the output voltage of the switch changes resulting in a variation to the input of the encoder matrix 54 and 56. The encoder matrix 54 and 56 generate a four (4) bit, binary coded decimal (BCD) output compatible with the needs of the frequency generation system. A separate code is generated for the units digit position in the tens digit position of the switch. The BCD output code of the unit encoder matrix 54 and the tens encoder matrix 56 are fed to the inputs of the three state drivers 66 and 70, associated with each of the indicators. The three state drivers 66 and 70 are controlled by enable signals 72 and 74 received from the clock 76. The outputs of the three state drivers 66 and 70 are connected to data buss line 68.

When the signal from the enable 72 and 74 is at a predetermined voltage, the outputs of each of the three state drivers 66 and 70 presents essentially an open circuit to the data buss line 68. When the enable line is at a second predetermined voltage, the outputs of the three state driver 66 and 70 are directly controlled by the input lines from the encoded matrixes 54 and 56. The respective signals from the encoder matrixes 54 and 56 are therefore time devisers multiplexed (TDM) onto the data buss line 68.

The time division multiplexing (TDM) is accomplished by having an astable oscillator for generating a square wave clock 76. The clock output 76 is applied simultaneously to the three state drivers 66 and 70 as well as to the units and tens latches 78 and 80. When a driver and its associated latch receives an inverted signal from the clock that driver and its associated latch is rendered inoperative, permitting the other three state driver and its associated latch to transmit. When the three state driver 66 and the units latch 78 are enabled, the input data of the three state driver 66 from the units encoder matrix 54 appears at the end of the data buss 68. Since the units latch 78 is enabled, the unit latch 78 can receive the output of the data buss 68 so that the output of the unit encoder matrix may be read and stored on unit latch 78. When the three state driver 70 associated with the tens encoder matrix 56 is enabled the output of the encoder matrix is fed to the input of the data buss 68 and into the tens latch 80 associated with the tens encoder matrix and three state driver 70 is enabled. The information may now be read and stored by the tens latch 80.

In this manner the signal received by the data buss 68 is de-multiplexed for reading and storage by the appropriate latch 78 or 80. The above process is continuously carried on, the units and tens position being alternately sampled, transmitted to and stored by the latches 78 and 80. In the preferred embodiment the latches 78 and 80 and the clock 76 are contained in the transceiver chassis, with the remainder of the circuitry contained in the microphone case. It is recognized, however, that due to miniaturization of components it is essentially a matter of choice as to what elements, may be contained in either the microphone case or the chassis.

The output of the tens latch 80 and the unit latch 78 are connected to a frequency generation system 86 which determines the correct frequencies to be generated for each of the channels.

In FIG. 6 the output of the unit encoder matrix 54 is connected to a seven segment BCD decoder 58 which also serves to drive a seven segment display for continuously displaying the unit digit 60 of the electrical digital display 42. Similarly, the output of the encoder matrix 56 for the tens digit is connected to the input of a seven segment BCD decoder 62 which serves to dry the tens digit 64 of the electrical digital display 42. In such a manner a two digit electrical display of a desired channel is achieved.

Referring to FIG. 7, an alternative embodiment of the configuration of FIG. 3 is shown. FIG. 7 is a circuit diagram, shown in block form, in which two individual thumb wheels 90 and 92 are employed in place of the single thumb wheel 44 shown in FIG. 3 and FIG. 3A. Each of the thumb wheels 90 and 92 have ten positions, whereby an individual channel from 00 to 99 may be selected and displayed. As shown in FIG. 7, the digital display 42 is shown on the microphone case in the same manner as described in association with the circuitry of FIG. 6, with the exception that the outputs of each of the thumb wheel controlled switches 90 and 92 are fed individually to their respective indicators 94 and 96, BCD encoder matrixes 98 and 100, seven segment BCD decoders 102 and 104, and ultimately to the electronic tens and unit digit display 106 and 108 located on the microphone case. The output of the ten position rotary switches 90 and 92 may be connected to a frequency generation system, or as preferred, connected to the circuit of FIG. 6, for generation of a frequency.

Referring to FIG. 4, an alternative embodiment of the present invention is shown in which separate pushbutton controls are employed for selecting the direction of change of the channel. In FIG. 4 a first push button 110 is shown for operating high channels and a second push button 112 is shown for selecting the low channels. As in the embodiment shown in FIG. 3 a two digit LED digital display 42 is employed to display the selected channel.

Referring to FIG. 8, the circuitry associated with the embodiment of the microphone shown in FIG. 4 is shown in block diagram form. A spring loaded pushbutton switch 110 is for selecting the upper numbered channel, while a second spring loaded pushbutton switch 112 is for selecting a lower numbered channel. The switches 110 and 112 are single-pole double-throw momentary push switches. The opposite contacts of each of the switches 110 and 112 receive the output of a variable rate system clock 114. The outputs of the switches 110 and 112 are fed to a NAND gate 116 which provides a count direction signal and a count clock signal which are transmitted in parallel to the chassis. The outputs of the NAND 116 are fed to a units BCD counter 118 and a tens BCD counter 120. One output of the unit BCD counter 118 is connected to the tens BCD counter 120 to activate the tens BCD counter when the units BCD counter 118 passes through its tens count. One output of the BCD units counter 118 and one output of the tens BCD counter 120 is connected to a high/low limit detector 122 which in turn has its output connected to a reset circuit 124, which has its output connected to the unit BCD counter 118 and to the tens BCD counter 120. The output of the BCD counter 118 and the tens BCD counter 120 are connected to three state drivers 126 and 128 respectively which are activated by a clock enable signal 130 and 132. The output of the drivers are connected to a data buss 134 which is then de-multiplexed so as to provide information for the frequency generation system 136 and transceiver 138, as well as to drive the tens digit display 140 and units digit display 142.

The operation of the circuitry of FIG. 8 is as follows: Once the up control switch 110 has been depressed an up count signal will be supplied to the control lines of the units BCD counter 118 and the tens BCD counter 120. The count clock applied to the BCD counters 118 and 120 activates the counters so that the units BCD counter 118 begins to count up from whatever count was previously stored in the units BCD counter. The unit's BCD counter steps one count at a time, with the tens BCD counter increasing one as the units BCD counter passes through a tenth step. The output of the units BCD counter 118 indicates the units digit of the selector channel while the output of the tens BCD counter 120 is indicative of the tens digit of the selected channel. The BCD counters 118 and 120 will continue to count so long as the up switch 110 is depressed.

The outputs of the units BCD counter 118 and the tens BCD counter 120 are sampled by the high/low detector 122. Should the counters be advanced so as to reach a maximum preset number plus one the output of the high/low limit detector 122 activates a reset circuit 124 which resets the units BCD counter 118 to a count of one and the tens BCD counter 120 to a count of zero. The high/low limit detector 122 may be preset to select the maximum channel permitted prior to the high/low limit detector 122 activating the reset circuit 124. At the present time, the maximum permissible number of channels permitted by the FCC for a citizen band radio is twenty-three. Accordingly, should the present system be employed in a citizens band radio unit the high/low limit detector would be set so that upon the units BCD counter 118 and the tens BCD counter 120 indicating a count of twenty-three upon the next count the high/low limit detector would activate the reset circuitry 124. The high/low limit detector 122 is connected to the transceiver 138. When the high/low limit detector 122 activates the reset circuit 124 the transceiver is disconnected until the new channel is present.

Similarly, when the down pushbutton switch 112 is depressed, the clock input to the units BCD counter 118 and the tens BCD counter 120 result in causing the counters to count down from whatever count was previously stored. The units BCD counter 118 is connected to the tens BCD counter 120 so that the units BCD counter is reset to 9 as the tens BCD counter passes through a tenth count. The high/low limit detector 122 detects the presence of a zero count in both the units BCD counter 118 and the tens BCD counter 120 so as to activate the reset circuit 124 to reset the units BCD counter 118 and the tens BCD counter 120 to the maximum permitted channel upon the next count. The remaining operation of the circuit in FIG. 8 is the same when the up pushbutton switch 110 is depressed.

The variable rate clock 114 determines the rate at which the units BCD counter 118 and the tens BCD counter 120 will count. Should the count be too rapid a user will pass or overshoot a desired channel. Such a user may vary the speed of the variable clock 114 so that the speed at which the channel indicator changes will be sufficient for the needs of such a user. Also, it is contemplated that the activation of the up push button switch 110 or the down push button switch 112 will not result in a continued signal being given to the units BCD counter 118 or tens BCD counter 120. In such an embodiment, the depression of either the up pushbutton switch 110 or the down pushbutton switch 112 would result in a single signal being transmitted to the counter so that the counter will change only once for each depression and release of the up 110 or down 112 pushbutton switch.

It is also contemplated that the up 110 and down 112 pushbuttons can be a multiple connection switch. Depression of either of the two pushbutton switches only a portion of the way, would result in the counters 118 and 120 counting at a first rate, while depression of either the up 110 or down 112 push button switch would result in the speed of the counters 118 and 120 increasing to a faster rate. In the alternative, a third button may be provided which operates at a faster rate than either the up or down button, such third button causing said counters to increase their count when depressed partially and to decrease the count of said counters 118 and 120 when depressed fully.

Referring to FIG. 9, an alternative embodiment of the circuitry associated with the microphone of FIG. 4 is shown in block form. Channel selection is controlled by two switches a unit switch 144 and a tens switch 146. The unit switch is connected to a bounce eliminating circuit having a delay of a preset number of clock periods. A second input into the bounce eliminating circuit 148 is from a clock, not shown. Likewise, the output of the tens switch 146 is connected to a bounce eliminating circuit 150 having a delay circuit, which also has a clock input not shown. The output of the units bounce eliminating circuit 148 is fed to the input of a unit counter 152. The output of the unit counter 152 is fed to the input of a three state driver 154 and to a unit limit reset circuit 156. The unit bounce eliminating circuit 148 and the tens bounce eliminating circuit 150 also have an output which is connected to AND Gate 158 which has a first output connected to the unit limit reset 156 and a second output to a tens reset circuit 160. The tens reset circuit 160 has a first output connected to the unit counter 152 and a second output connected to a tens counter 162. The bounce eliminating circuit 150 associated with the tens switch 146 has an output connected to an OR Gate 164 which has a second input from the unit counter 152. The output of the OR Gate 164 is connected to the tens counter 162. The unit limit reset circuit 156 has a first output connected to the unit counter 152 and a second output connected to the tens counter 162. The tens counter 162 has a first output connected to the unit limit reset 156 and a second output connected to a three state driver 166 which has a second input from a clock not shown. The three state driver has an input from a clock not shown and an output which is connected to a data buss 168. The data buss 168 also has an input from the three state driver 166 and from the units bounce eliminating circuit 148. A unit decoding circuit 170 and a tens decoder circuit 172 have one input from the data buss 168 and a second input from the bounce eliminating circuit 148. The units and tens decoder circuits 170 and 172 have their outputs connected to a units display 174 and a tens digit display 176 respectively. The decoding circuits 170 and 172 have a second output which is connected to a frequency generating system 178 which is connected to a transceiver 180.

Channel selection is controlled by the two pushbuttons 144 and 146, one being a unit switch 144 which advances the channel one unit at a time while the other push button 146 is used to advance the channel in increments of ten. Depressing both the unit switch 144 and the tens switch 146 at the same time results in the channel being reset to the Channel One.

When the units advance switch 144 is depressed a low voltage is applied to the input of a bounce eliminating circuit 148 which has a built in delay. Four clock periods after the switch contacts have stopped bouncing, a low output signal will be provided by the eliminator. The use of the bounce eliminator 148 prevents false signals from being transmitted in the system and thus unintentionally advancing the channel. The output of the bounce eliminating circuit 148 is fed to the output of a unit counter 152. The output of the unit counter 152 is a BCD signal dependent on the number of counts contained in the unit counter. Each time the unit switch 144 is depressed a signal is sent to the unit counter to increase the count contained in the unit counter 152 by one.

Upon the depression of the tens switch 146 low voltage is applied to the input of a second bounce eliminator 150 having a built in delay which operates in the same manner as the bounce eliminating circuit 148. The output of bounce elements 150 is applied to the input of an OR Gate 164 which has its output connected to a tens counter 162. Each time the tens switch 146 is depressed it advances the tens counter by ten (10), moving the selected channel to a position ten channels more than previously stored in the counter. The tens counter 162 also receives an input from the unit counter 152 when the unit counter passes through a ten count causing the tens counts to increase one count.

The output of the unit counter 152 and the tens counter 162 is sampled by the unit limit reset circuit 156 which may be preset for the maximum permitted channel. When the unit limit reset circuit 156 detects a maximum channel plus one the unit counter 152 and the tens counter 162 are reset to Channel One.

The output of the tens counter 162 is connected to a three state driver 166 which also receives an input from a clock not shown. The outputs of the three state drivers 154 and 166 are wired in parallel to a four wire data buss 168 which feeds the digit data of the selected channel. The information transmitted to the data buss 168 is transmitted using time division multiplexing (TDM), the bounce eliminating delay circuit 148, containing the clock.

As a result of the delay in the bounce eliminators 148 and 150 a signal is generated for an enable pulse for the three state drivers at the input to the data buss 168. In the preferred embodiment four (4) sequential enable pulses for the three state drivers are provided. Each of the outputs of the three state drivers 156 and 154 are essentially in an open circuit condition until the receipt of an enable signal of predetermined voltage. When the proper enable signal is received, the respective three state driver 154 or 156 will transmit information to the data buss 168. The decoder circuits 170 and 172 contain latches which are responsive to the signal transmitted by the enable circuitry associated with the bounce eliminators.

For example, the signal of four bits of information such as bit 8, bit 4, bit 2 not, and bit 1 not (8, 4, $\bar{2}$, $\bar{4}$) would enable the units information transmitted through the three state driver 154 to be transmitted to the latch associated with the units digital display system. Likewise, an enable data train of bit 8, bit 4 not, bit 2 and bit 1 not (8, $\bar{4}$, 2 and $\bar{1}$) would permit the transmission of the tens BCD data received by the input of the three state driver 166. When an improper code is detected the latches do not operate and the outputs of the three state drivers 166 and 154 are not enabled to be transmitted through the data buss 168. The information received by the latches contained in the decoding circuits 170 and 172, are in this manner, transmitted to the frequency generation system 178 and in turn to the transmitter 180.

It is recognized that variations to the above invention may be possible without departing from the scope of the present invention.

What is claimed is:

1. A remote microphone unit for use with a transceiver apparatus, said remote microphone unit comprising:
    first and second switching means for selecting a desired channel from a plurality of available transmission channels, activation of said first and second switching means generating signals representing the selected channel,
    an electronic digital display for displaying the selected channels, and
    means responsive to said generated electrical signals for generating the channel selected in electronic digital form to said electronic digital display, wherein
    said digital display contains at least first and second indicators, said first indicator indicating the unit digit of a two digit channel and said second indicator indicating the tens digit of said channel, said units digit display being controlled by said first switching means and said tens unit display being controlled by said second switching means.

2. The remote microphone as defined in claim 1 further including means coupled to said responsive means for generating a frequency signal representing said selected channel.

3. The remote microphone as defined in claim 1 wherein said electronic digital display comprises lighting means to permit viewing and operation of the microphone in dark conditions.

4. The remote microphone as defined in claim 3 wherein said light means comprises light emitting diodes.

5. The remote microphone as defined in claim 1 further including means associated with said remote microphone unit for resetting the displayed channel to a maximum preset channel when the selected channel is reduced below the lowest available channel.

6. The remote microphone of claim 5 including means associated with said remote microphone unit for resetting the displayed channel to the minimum preset channel when the selected channel is raised above the highest available transmission channel.

7. A remote microphone unit for use with a transceiver apparatus, said remote microphone unit comprising:
    first and second switching means for selecting a desired channel from a plurality of available transmission channels, activation of said first and second switching means generating signals representing the selected channel,
    an electronic digital display for displaying the selected channels, and
    means responsive to said generated electrical signals for generating the channel selected in electronic digital form to said electronic digital display, wherein
    the engagement of said first switching means causes the count in said digital display to increase towards the maximum present channel and the engagement of said second switching means causes the count rate in said digital display to decrease toward to lowest available transmission channel.

8. The remote microphone as defined in claim 7 further including circuit means for controlling the counting rate in said digital display as said first switching means is engaged.

9. The remote microphone as defined in claim 7 further including circuit means for controlling the counting rate in said digital display as said second switching means is engaged.

* * * * *